US007982127B2

(12) United States Patent
Wu et al.

(10) Patent No.: US 7,982,127 B2
(45) Date of Patent: Jul. 19, 2011

(54) THIN FILM SOLAR CELL MODULE OF SEE-THROUGH TYPE

(75) Inventors: Jian-Shu Wu, Yunlin County (TW); Te-Chi Wong, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 46 days.

(21) Appl. No.: 12/061,663

(22) Filed: Apr. 3, 2008

(65) Prior Publication Data

US 2008/0178925 A1 Jul. 31, 2008

Related U.S. Application Data

(63) Continuation-in-part of application No. 11/682,319, filed on Mar. 6, 2007.

(30) Foreign Application Priority Data

Dec. 29, 2006 (TW) .............................. 95149988 A
Feb. 8, 2007 (TW) .............................. 96104570 A

(51) Int. Cl.
*H02N 6/00* (2006.01)
*H01L 31/042* (2006.01)
(52) U.S. Cl. ....................................... 136/249; 136/244
(58) Field of Classification Search .................. 136/244, 136/249, 252
See application file for complete search history.

(56) References Cited

U.S. PATENT DOCUMENTS

| 4,410,558 A | * | 10/1983 | Izu et al. | 438/62 |
| 4,514,579 A | * | 4/1985 | Hanak | 136/249 |
| 4,668,840 A | | 5/1987 | Kiyama et al. | |
| 4,772,335 A | * | 9/1988 | Huang | 136/258 |
| 4,795,500 A | | 1/1989 | Kishi et al. | |
| 5,176,758 A | * | 1/1993 | Nath et al. | 136/251 |
| 5,421,908 A | * | 6/1995 | Yoshida et al. | 136/244 |
| 5,468,988 A | * | 11/1995 | Glatfelter et al. | 257/431 |
| 6,541,695 B1 | * | 4/2003 | Mowles | 136/252 |
| 6,858,461 B2 | | 2/2005 | Oswald et al. | |
| 2002/0011641 A1 | * | 1/2002 | Oswald et al. | 257/447 |
| 2002/0153037 A1 | * | 10/2002 | Fischer | 136/244 |
| 2006/0157103 A1 | * | 7/2006 | Sheats et al. | 136/244 |

FOREIGN PATENT DOCUMENTS

CN 1723573 1/2006
JP 11312816 A * 11/1999

OTHER PUBLICATIONS

English machine translation of JP11312816A (Nov. 1999).*

* cited by examiner

*Primary Examiner* — Jennifer K. Michener
*Assistant Examiner* — Eli S Mekhlin
(74) *Attorney, Agent, or Firm* — Jianq Chyun IP Office

(57) ABSTRACT

A thin film solar cell module of see-through type and method of fabricating the same is provided. The method includes forming scribe lines in two directions in a first electrode material layer disposed on an opaque substrate so as to avoid short circuit caused by a high-temperature laser scribing process and reduction of the process yield. Moreover, the thin film solar cell module of see-through type has holes through the opaque substrate so that the cell module increases the transmittance of the cells.

8 Claims, 22 Drawing Sheets

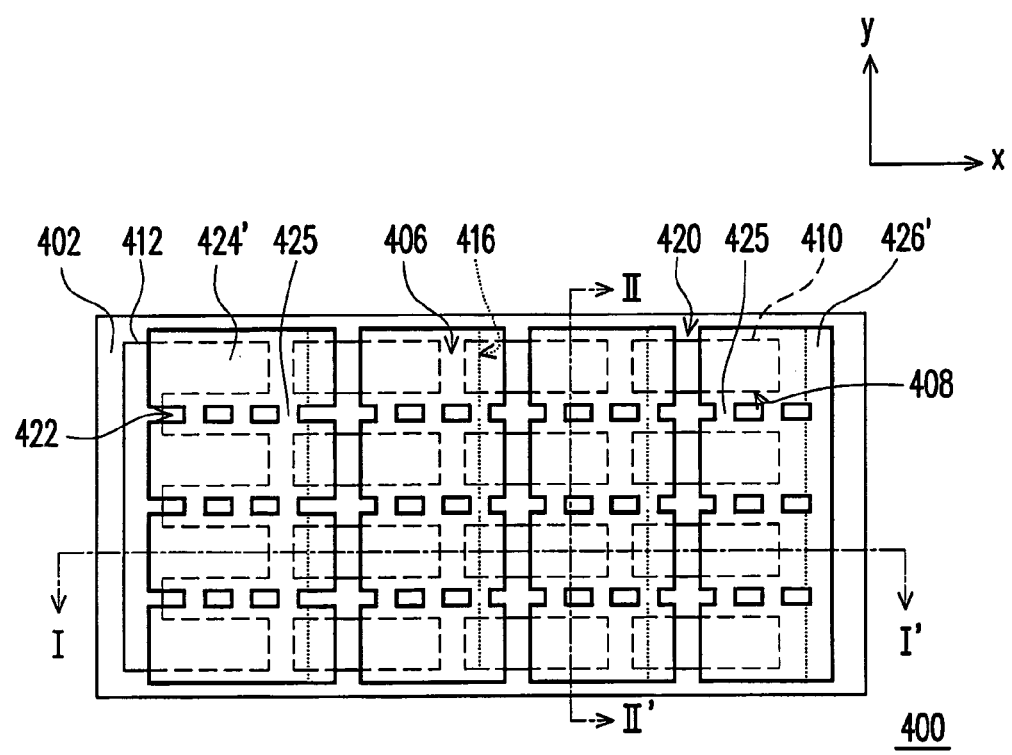
FIG. 9 (a')

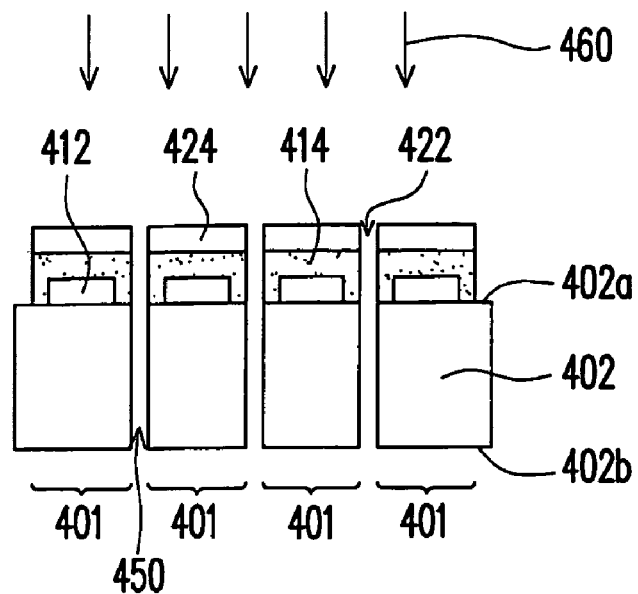
FIG. 9 (c)
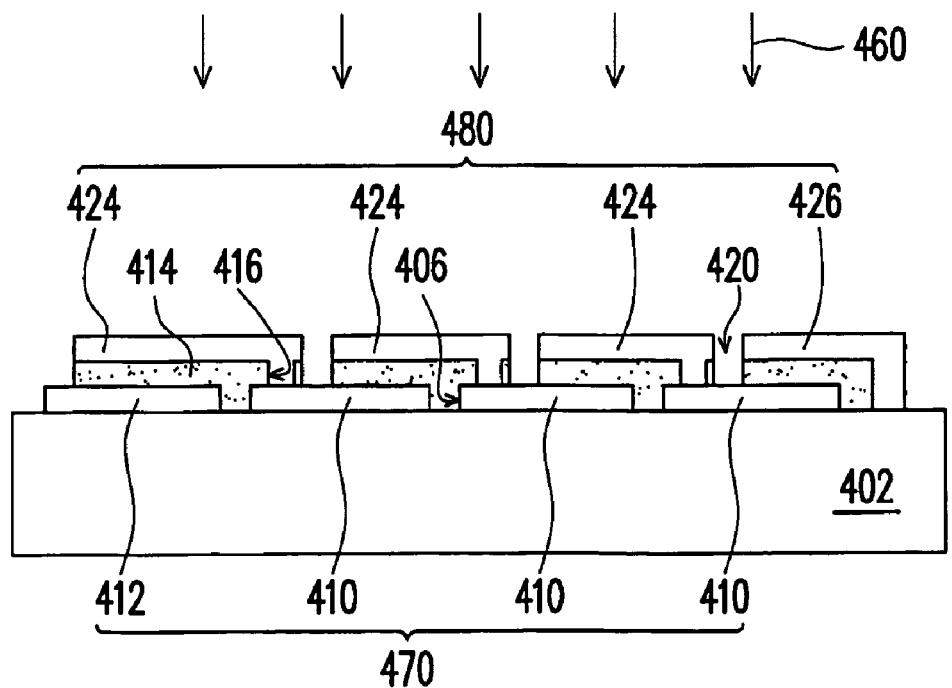
FIG. 9 (b')

THIN FILM SOLAR CELL MODULE OF SEE-THROUGH TYPE

CROSS-REFERENCE TO RELATED APPLICATION

This application is a continuation-in-part of a prior-filed nonprovisional application Ser. No. 11/682,329, filed on Mar. 6, 2007, which claims the priority benefits of Taiwan application serial no. 95149988, filed on Dec. 29, 2006 and no. 96104570, filed on Feb. 8, 2007. The entirety of each of the above-mentioned patent applications is hereby incorporated by reference herein and made a part of specification.

BACKGROUND OF THE INVENTION

1. Field of the Invention

The present invention relates to a photovoltaic module and a method for fabricating the same, and particularly relates to a thin film solar cell module of see-through type and a method for fabricating the same.

2. Description of Related Art

Solar energy is a renewable energy, which causes no pollution. It has been the focus in the development of environmental-friendly energy as an attempt to counter the problems such as pollution and shortage of fossil fuels. Herein, solar cells can be used to directly convert solar energy into electrical energy, which becomes a very important research topic now.

Currently, mono-silicon and poly-silicon cells account for more than 90% of the solar cell market. However, manufacturing these types of solar cells requires silicon chips with thickness of 150~350 micrometers, which increases the production costs. Furthermore, the raw material of solar cells is high-purity silicon ingot. Due to the significant increase in the consumption of silicon ingot, it is being depleted by day. Hence, thin film solar cells have become the new direction in the research and development of solar energy. Thin film solar cells are suitable for mass production and have the advantages of lower production costs and simpler module fabricating process.

FIG. 1 schematically illustrates a conventional thin film solar cell module. As shown in FIG. 1, a thin film solar cell module 150 comprises a glass substrate 152, a transparent electrode 154, a photoelectric conversion layer 156, and a metal electrode 158. Herein, the transparent electrode 154 is disposed on the glass substrate 152. The photoelectric conversion layer 156 is disposed on the transparent electrode 154 by position displacement. In addition, the metal electrode 158 is disposed on the photoelectric conversion layer 156 by position displacement and is in contact with the transparent electrode 154 underneath. In the thin film solar cell module 150, the photoelectric conversion layer 156 usually includes a p-i-n structure composed of a p-type semiconductor, an intrinsic semiconductor, and an n-type semiconductor. Light is transmitted through the bottom of the glass substrate 152 and is absorbed by the photoelectric conversion layer 156 to generate electron-hole pairs. The electron-hole pairs are then separated by an electric field established across the device to form a voltage and an electric current, which are transmitted by a conductive wire for loading. To enhance the efficiency of the cells, in the conventional thin film solar cell module 150, pyramid-like structures or textured structures (not shown) are formed on the surface of the transparent electrode 154 to reduce the reflection of light. The photoelectric conversion layer 156 is usually formed by using an amorphous silicon thin film. However, the band gap of the amorphous silicon thin film is usually between 1.7 eV and 1.8 eV, which merely absorbs sunlight of wavelength less than 800 nm. To increase the utility of light, usually a layer of micro-crystalline (or nano-crystalline) thin film is stacked on the amorphous silicon thin film to form a p-i-n/p-i-n tandem solar cell. The band gap of micro-crystalline (or nano-crystalline) is usually between 1.1 eV and 1.2 eV, which absorbs sunlight of wavelength less than 1100 nm.

In the early times, it was costly and difficult to manufacture solar cells, and solar cells were only used in special fields such as astronautics. Now solar cells, which feature converting solar energy into electric energy, have become more widely used and applied. The applications of solar cells range from the use in apartments and high-rise buildings to that in camper vans and portable refrigerators. However, silicon wafer solar cells are not suitable for certain applications such as transparent glass curtains and buildings integrated with photovoltaic (BIPV). Thin film solar cells of see-through type are used in the aforesaid applications because they are energy-efficient and pleasing to the eye. Further, they accommodate more readily with our living demands.

Currently, techniques related to the thin film solar cells of see-through type and the methods for fabricating the same have been disclosed in some U.S. patents.

U.S. Pat. No. 6,858,461 (U.S. Pat. No. 6,858,461 B2) provides a partially transparent photovoltaic module. As shown in FIG. 2, a photovoltaic module 110 includes a transparent substrate 114, a transparent conductive layer 118, a metal electrode 122, and a photoelectric conversion layer disposed between the transparent conductive layer 118 and the metal electrode 122. Similarly, light is transmitted through the bottom of the transparent substrate 114. In the photovoltaic module 110, a laser scribing process is performed to remove a portion of the metal electrode 122 and a portion of the photoelectric conversion layer to form at least one groove 140 so as to achieve partial transparency of the photovoltaic module 110. However, the laser scribing process is performed at a high temperature. Due to such a high temperature, the metal electrode 122 easily forms metal residues or melts down and accumulates in the grooves, resulting in short circuits of the top and bottom electrodes. On the other hand, an amorphous silicon photoelectric conversion layer recrystallizes at such a high temperature and forms low resistant micro-crystalline (or nano-crystalline) silicon on the sidewalls of the grooves. Consequently, current leakage is increased, and the process yield and the efficiency of the solar cells are affected. In addition, pyramid-like structures or textured structures are usually formed on the surface of the transparent conductive layer 118 to enhance the efficiency of the cells. However, light transmittance is not effectively enhanced because the light transmitted through the bottom of the transparent substrate 114 would be scattered.

In view of the above, to achieve a certain level of light transmittance, larger portions of the metal electrode and the photoelectric conversion layer in a solar cell need to be removed. Please refer to Table 1, which lists the technical specifications of various thin film cells of see-through type manufactured by MakMax Taiyo Kogyo (Japan). According to Table 1, to increase light transmittance, larger portions of the metal electrode and the photoelectric conversion layer need to be removed to decrease the maximum output, efficiency, and fill factor (FF).

TABLE 1

| | Type | | |
|---|---|---|---|
| | KN-38 | KN-45 | KN-60 |
| Size (mm) | 980 × 950 | 980 × 950 | 980 × 950 |
| Transmittance Rate (%) | 10 | 5 | <1 |
| Maximum Power Output (W) | 38.0 | 45.0 | 58.0 |
| Vpm (V) | 58.6 | 64.4 | 68.0 |
| Ipm (A) | 0.648 | 0.699 | 0.853 |
| Voc (V) | 91.8 | 91.8 | 91.8 |
| Isc (A) | 0.972 | 1.090 | 1.140 |
| Efficiency | 4.1 | 4.8 | 6.2 |
| FF | 0.43 | 0.45 | 0.55 |

In addition, a photovoltaic device is disclosed in U.S. Pat. No. 4,795,500 (U.S. Pat. No. 4,795,500). As shown in FIG. 3, a photovoltaic device includes a transparent substrate 1, a transparent conductive layer 3, a photoelectric conversion layer 4, a metal electrode 5, and a photoresist layer 8. In the photovoltaic device, holes 6 are formed in the metal electrode 5, the photoelectric conversion layer 4, and even in the transparent conductive layer 3 to achieve transparency. Nevertheless, this patent utilizes a lithographic process which requires expensive facilities and increases the production costs. Additionally, if this patent utilizes a laser scribing process to directly form the holes 6, the problems of metal residue contamination and short circuit will occur to affect the process yield.

SUMMARY OF THE INVENTION

Accordingly, the present invention provides a thin film solar cell module of see-through type and a method for fabricating the same, which increase light transmittance of the cell module and overcome the shortcomings such as short circuit and current leakage encountered by a conventional fabricating method, and further improve the process yield and the efficiency of the solar cell.

The present invention provides a method for fabricating a thin film solar cell module of see-through type. First, a first electrode material layer is formed on an opaque substrate. Then, a portion of the first electrode material layer is removed to form a plurality of first Y-directional scribe lines, which divides the first electrode material layer into a plurality of banding electrode material layers; and a plurality of first X-directional scribe lines is formed to intersect with the first Y-directional scribe lines, which further divides the first electrode material layer into a first comb electrode and a two-dimensional array composed of a plurality of block-like first electrodes. Next, a photoelectric conversion layer is formed to cover the opaque substrate, the first electrodes, and a portion of the first comb electrode. Thereafter, a portion of the photoelectric conversion layer is removed to form a plurality of second Y-directional scribe lines, which are parallel to the first Y-directional scribe lines, above the first electrodes. A second electrode material layer is then formed to cover the photoelectric conversion layer, the first electrodes, and the opaque substrate. Following that, a portion of the second electrode material layer and a portion of the photoelectric conversion layer are removed to form a plurality of third Y-directional scribe lines, which exposes surfaces of the first electrodes. Further, a plurality of second X-directional scribe lines is formed in the first X-directional scribe lines to expose the opaque substrate and to divide the second electrode material layer into a second comb electrode and a two-dimensional array composed of a plurality of block-like second electrodes. Thereafter, a portion of the opaque substrate exposed by the second X-directional scribe lines and the third Y-directional scribe lines is removed to form a plurality of holes in the opaque substrate.

The present invention provides a thin film solar cell module of see-through type, which has a plurality of cells connected in series and disposed on an opaque substrate. Among the cells, a plurality of holes passing through the opaque substrate is formed. The thin film solar cell module of see-through type comprises a first electrode, a second electrode, and a photoelectric conversion layer. Herein, the first electrode is disposed on the opaque substrate and is composed of a first comb electrode and a two-dimensional array composed of a plurality of block-like first electrodes. The second electrode is disposed above the first electrode and is composed of a second comb electrode and a two-dimensional array composed of a plurality of block-like second electrodes. A portion of the block-like first electrodes, a portion of the opaque substrate, and the holes are exposed between the second comb electrode and the block-like second electrodes. The second comb electrode and the first comb electrode are disposed symmetrically, and the block-like first electrodes and the block-like second electrodes are disposed by parallel displacement. Moreover, the photoelectric conversion layer is disposed between the first electrode and the second electrode. The photoelectric conversion layer is composed of a two-dimensional array composed of a plurality of photoelectric conversion material layers.

The present invention provides another method for fabricating a thin film solar cell module of see-through type. First, a first electrode material layer is formed on an opaque substrate. Next, a portion of the first electrode material layer is removed to form a plurality of first Y-directional scribe lines, which divides the first electrode material layer into a plurality of banding electrode material layers, and a two-dimensional array of a plurality of first X-directional windows is formed to divide the first electrode material layer into a plurality of first window electrodes. Afterward, a photoelectric conversion layer is formed to cover the first window electrodes and the opaque substrate. Thereafter, a portion of the photoelectric conversion layer is removed to form a plurality of second Y-directional scribe lines, which are parallel to the first Y-directional scribe lines, above the first window electrodes. A second electrode material layer is then formed on the photoelectric conversion layer. Following that, a portion of the second electrode material layer and a portion of the photoelectric conversion layer are removed to form a plurality of third Y-directional scribe lines, which exposes the surfaces of the first window electrodes. Further, a plurality of second X-directional scribe windows is formed in the first X-directional scribe lines to divide the second electrode material layer into a plurality of second window electrodes, which exposes the opaque substrate. The opaque substrate exposed by the second X-directional scribe windows is removed to form a plurality of holes in the opaque substrate.

The present invention provides another thin film solar cell module of see-through type, which has a plurality of cells connected in series in the X-direction and connected in parallel in the Y-direction, and a plurality of through holes passing through an opaque substrate is formed among the cells. The thin film solar cell module of see-through type comprises the opaque substrate, a first electrode, a second electrode, and a photoelectric conversion layer. Herein, the opaque substrate has a plurality of holes. The first electrode is disposed on the opaque substrate and is composed of a plurality of block-like first window electrodes. The block-like first window electrodes have a plurality of first scribe windows corresponding to the holes. The second electrode is disposed on the first electrode and is composed of a plurality of block-like second window electrodes. The block-like second window electrodes have a plurality of second scribe windows corresponding to the holes and the first scribe windows to form the through holes. The second window electrodes and the first window electrodes are disposed by parallel displacement. In addition, the photoelectric conversion layer is disposed between the first electrode and the second electrode. The photoelectric conversion layer is composed of a plurality of window photoelectric conversion material layers.

According to the thin film solar cell module of see-through type and the method for fabricating the same of the present invention, bi-directional scribe lines oe scribe window are formed during the formation of the first electrode. Consequently, the thin film solar cell module of see-through type of the present invention overcomes the problems of short circuit and current leakage caused by a high-temperature laser scribing process, and further improves the process yield and the efficiency of the solar cells. In addition, compared with a conventional thin film solar cell module of see-through type, the thin film solar cell module of see-through type according to the present invention has a plurality of holes in the opaque substrate, which avoids the scattering of light caused by the pyramid-like structures or textured structures on the surface of a transparent oxide electrode. Hence, the light transmittance is greatly increased.

To make the above and other objectives, features, and advantages of the present invention more comprehensible, several embodiments accompanied with figures are detailed as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIG. 4 through FIG. 9 illustrate a process flow for fabricating a thin film solar cell module of see-through type according to an embodiment of the present invention. Herein, the sub-diagrams (a) and (a') of FIG. 4 through FIG. 9 are schematic top views of FIG. 4 through FIG. 9. The sub-diagrams (b) and (b') of FIG. 4 through FIG. 9 are schematic cross-sectional views along the line I-I'. The sub-diagrams (c) of FIG. 4 through FIG. 9 are schematic cross-sectional views along the line II-II'.

Figure 1:
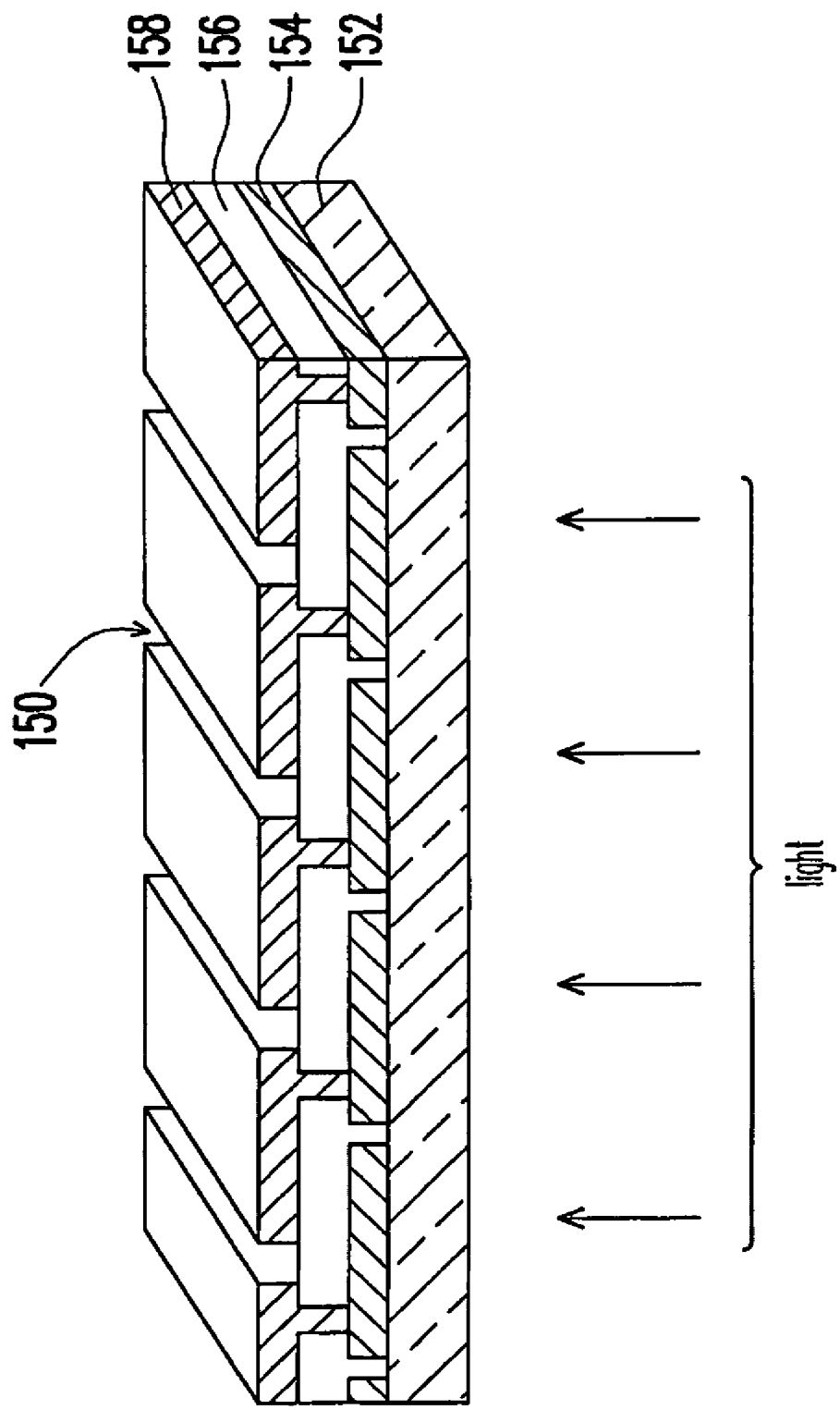
FIG. 1 schematically illustrates a conventional thin film solar cell module.
Figure 2:
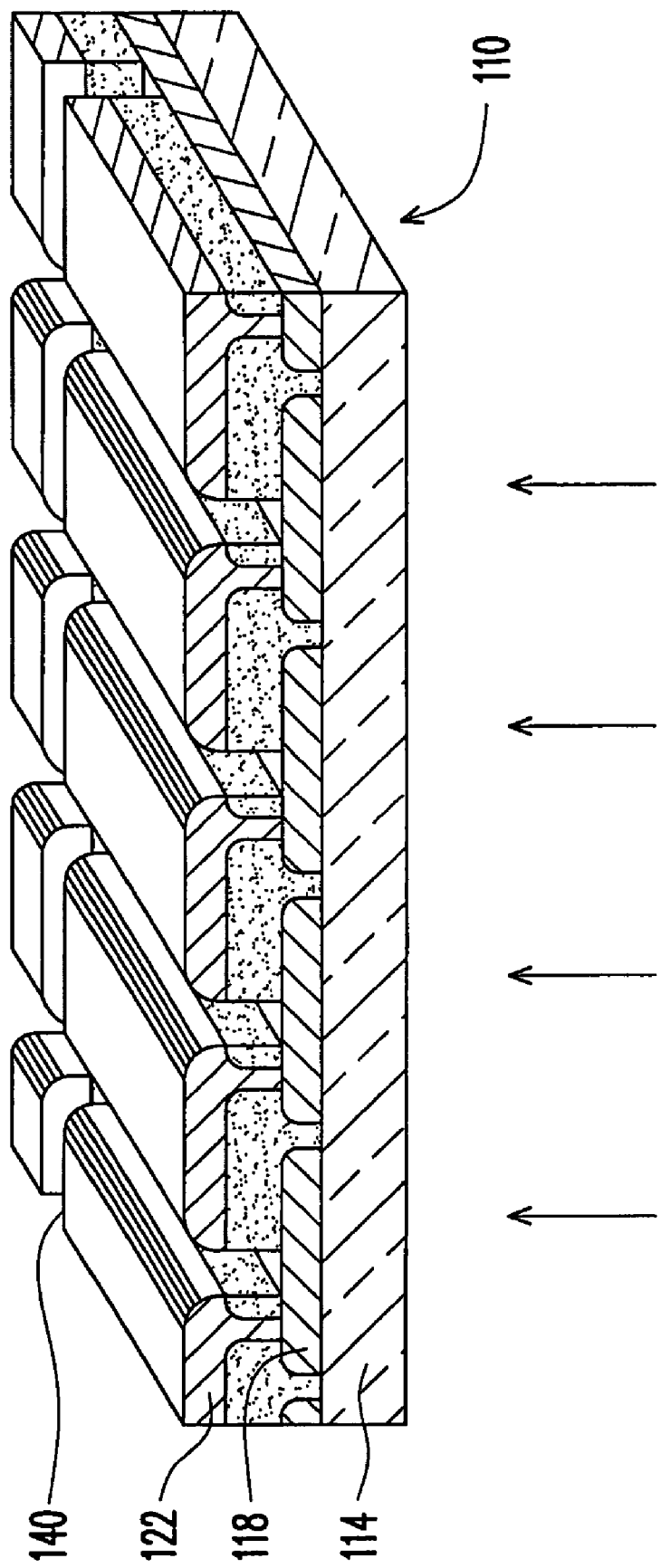
FIG. 2 schematically illustrates a conventional solar cell module.
Figure 3:
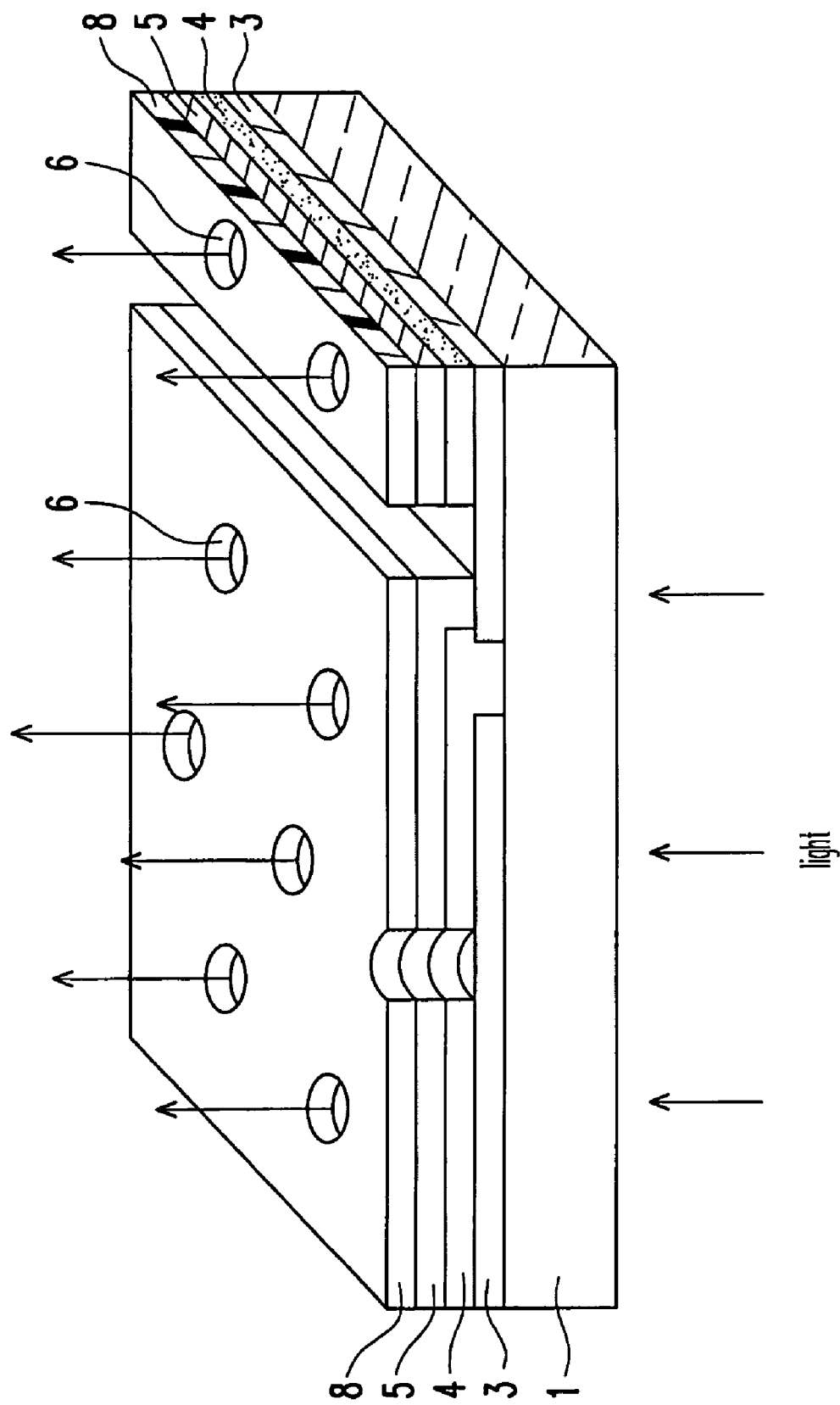
FIG. 3 schematically illustrates a conventional solar cell device.
Figure 4:
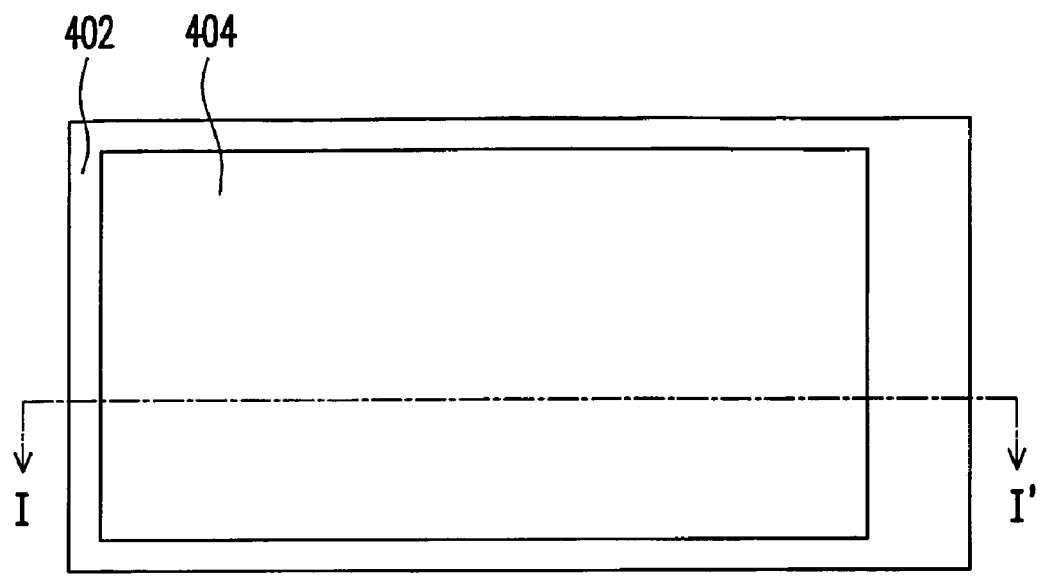
FIG. 4 through FIG. 9 illustrate a process flow for fabricating a thin film solar cell module of see-through type according to an embodiment of the present invention. Herein, the sub-diagrams (a) of FIG. 4 through FIG. 8 are schematic top views of FIG. 4 through FIG. 8. The sub-diagrams (b) of FIG. 4 through FIG. 9 are schematic cross-sectional views along the line I-I'. The sub-diagrams (a) and (a') of FIG. 9 are schematic top views of two different embodiments. The sub-diagrams (b) and (b') of FIG. 9 are schematic cross-sectional views along the line I-I' in the two embodiments. The sub-diagram (c) of FIG. 9 is a schematic cross-sectional view along the line II-II'.
Figure 4:
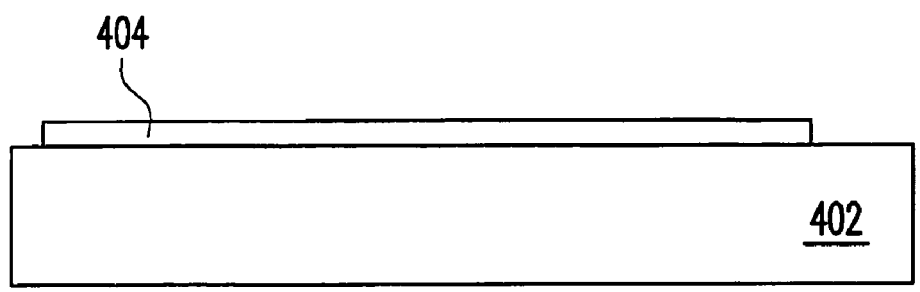
Figure 5:
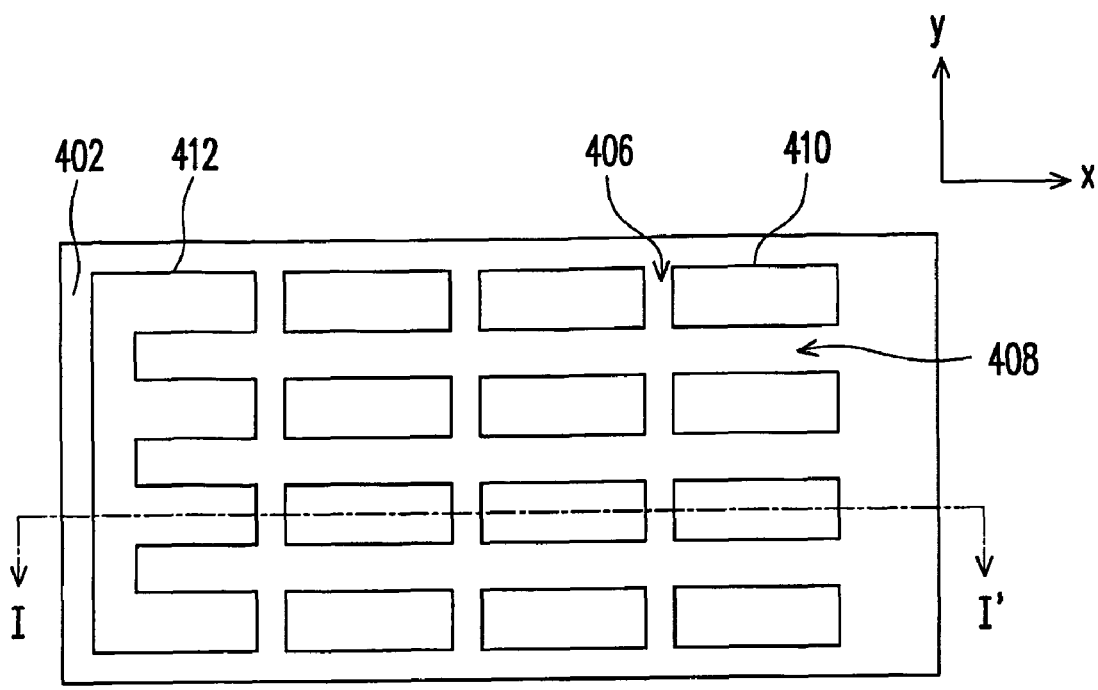
Figure 5:
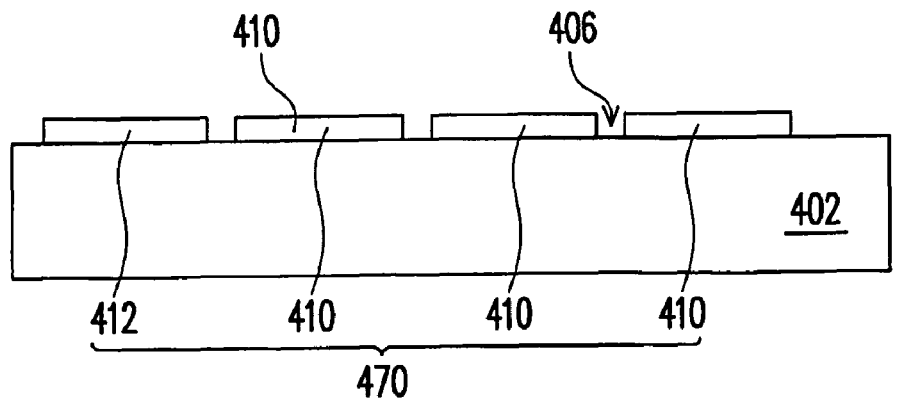
Figure 6:
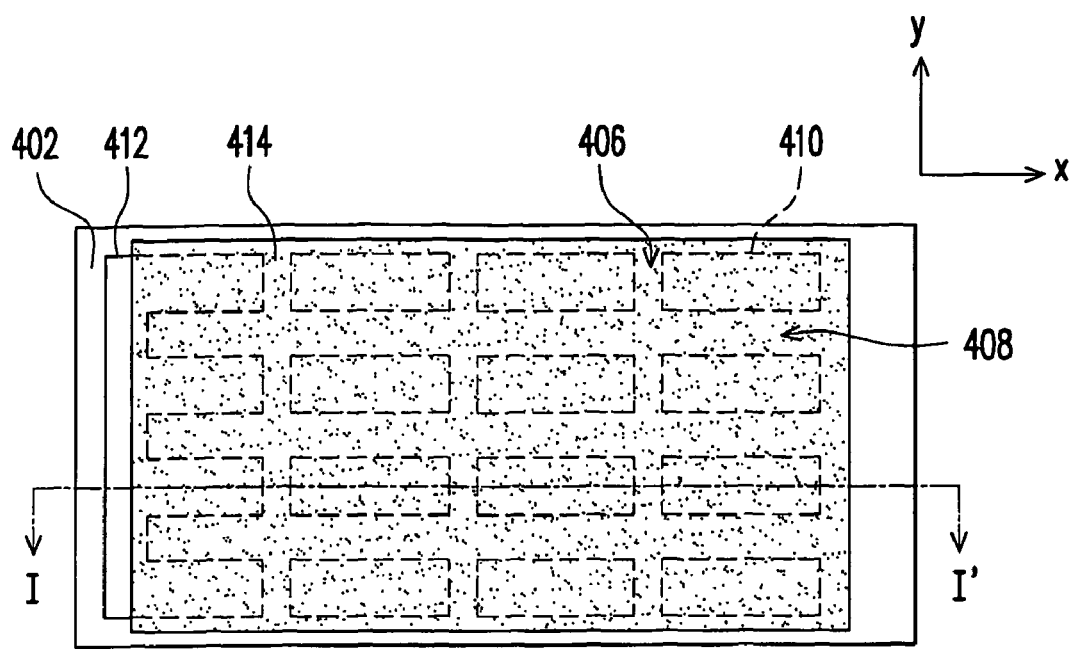
Figure 6:
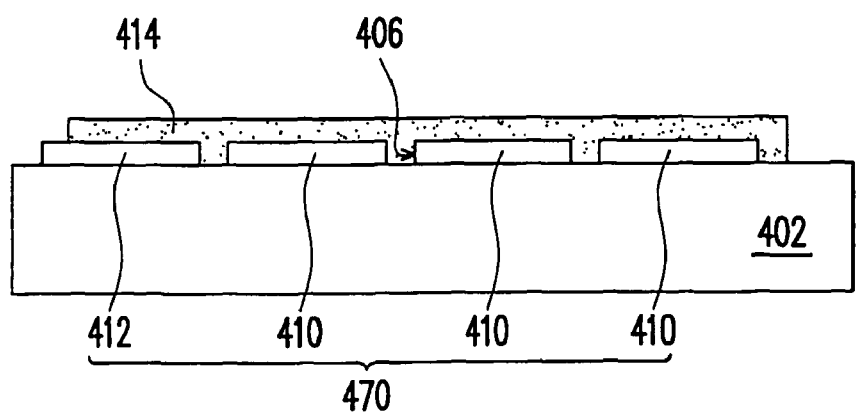
Figure 7:
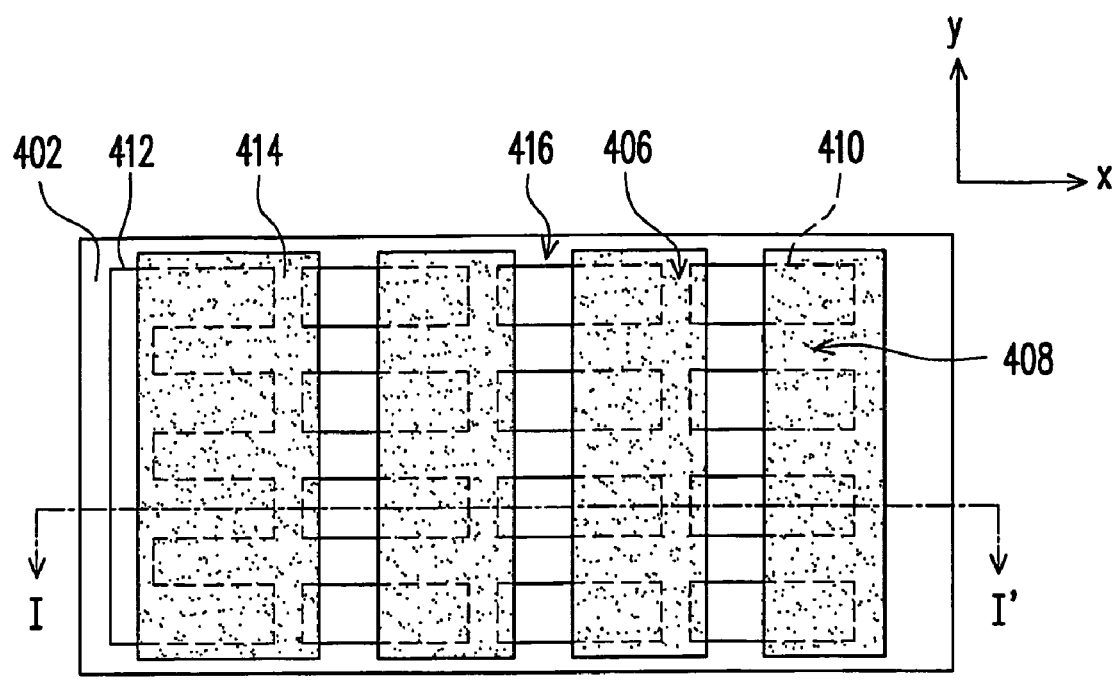
Figure 7:
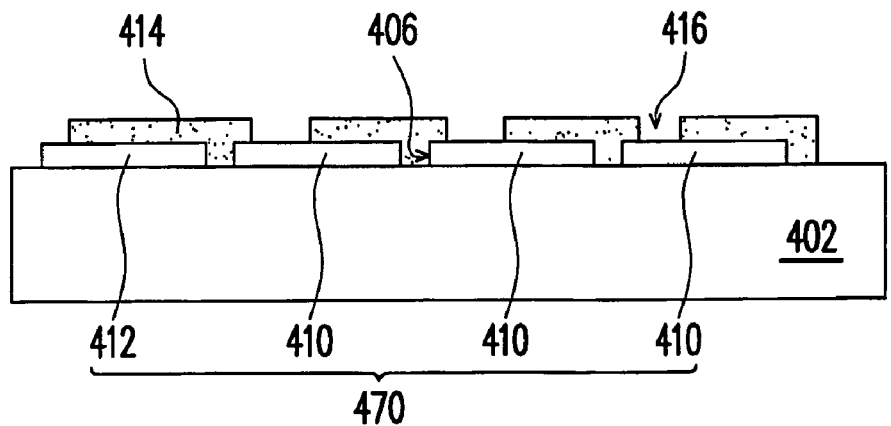
Figure 8:
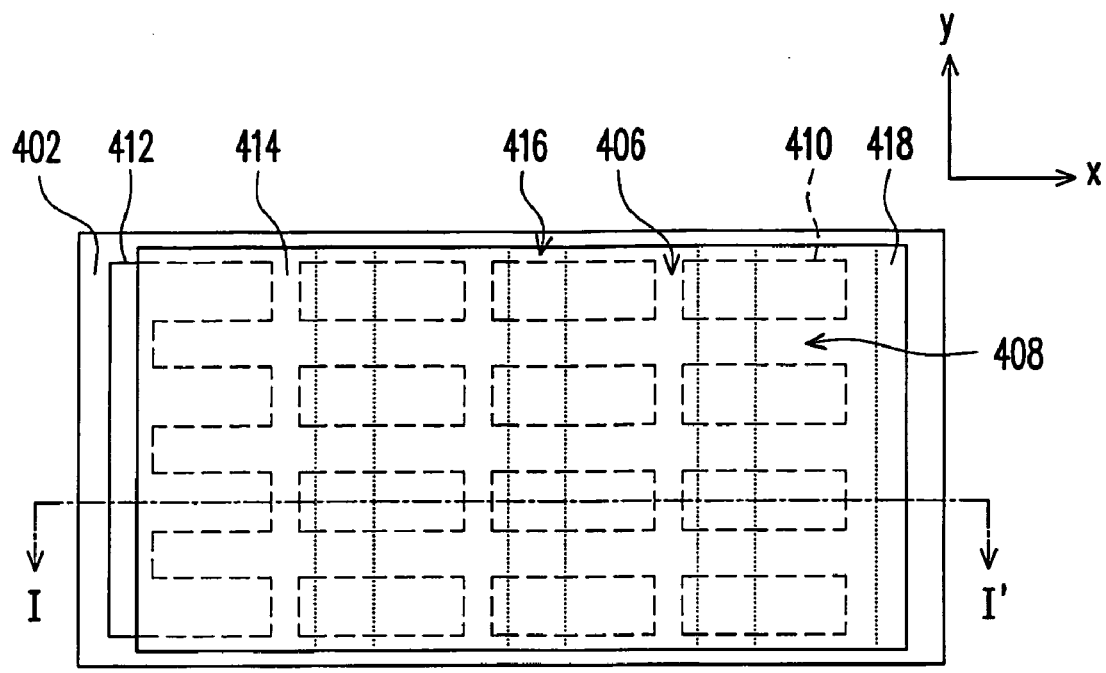
Figure 8:
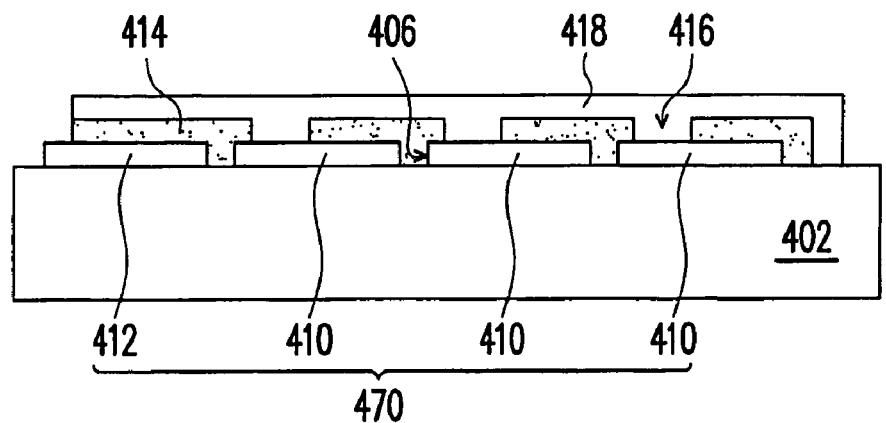
Figure 9:
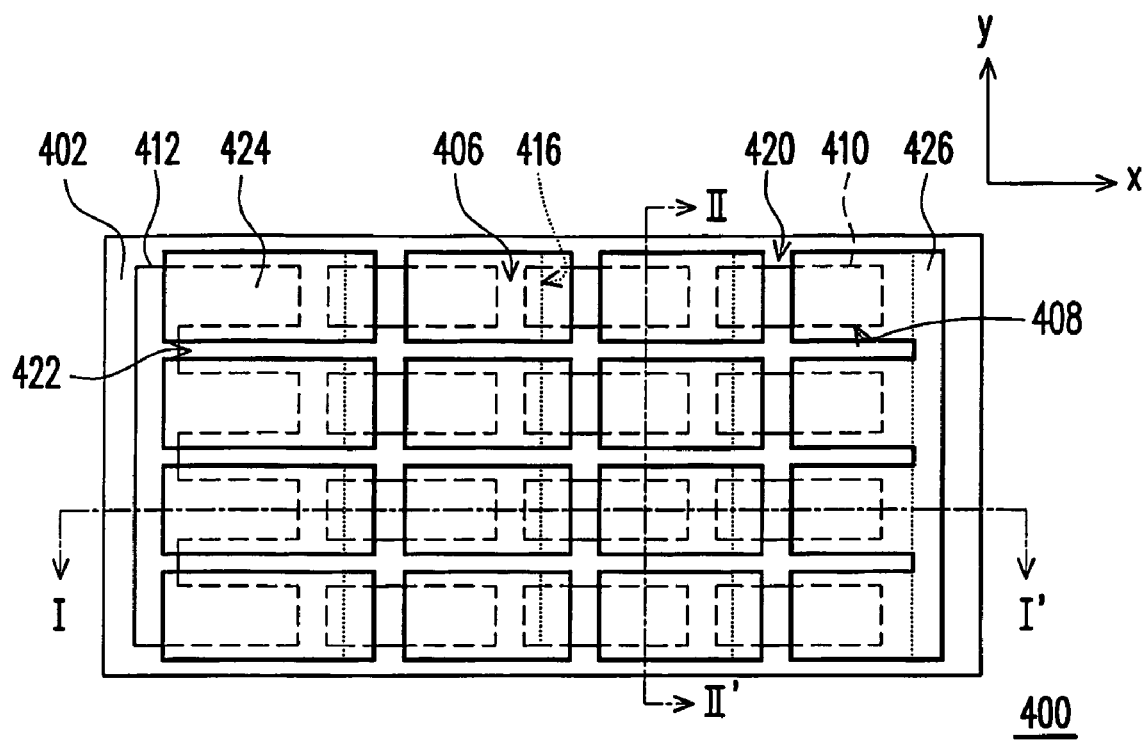
Figure 9:
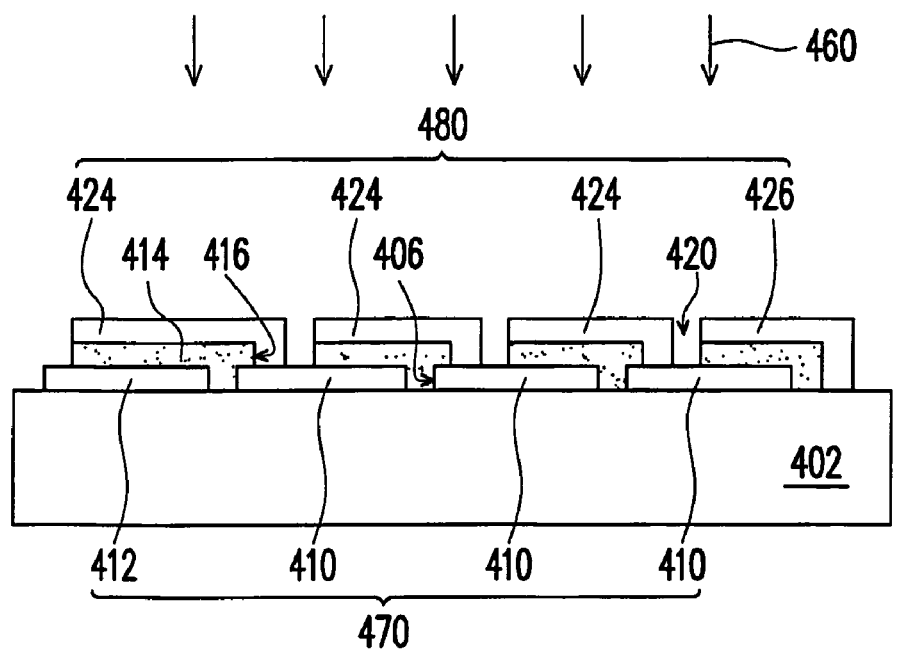
Figure 10:
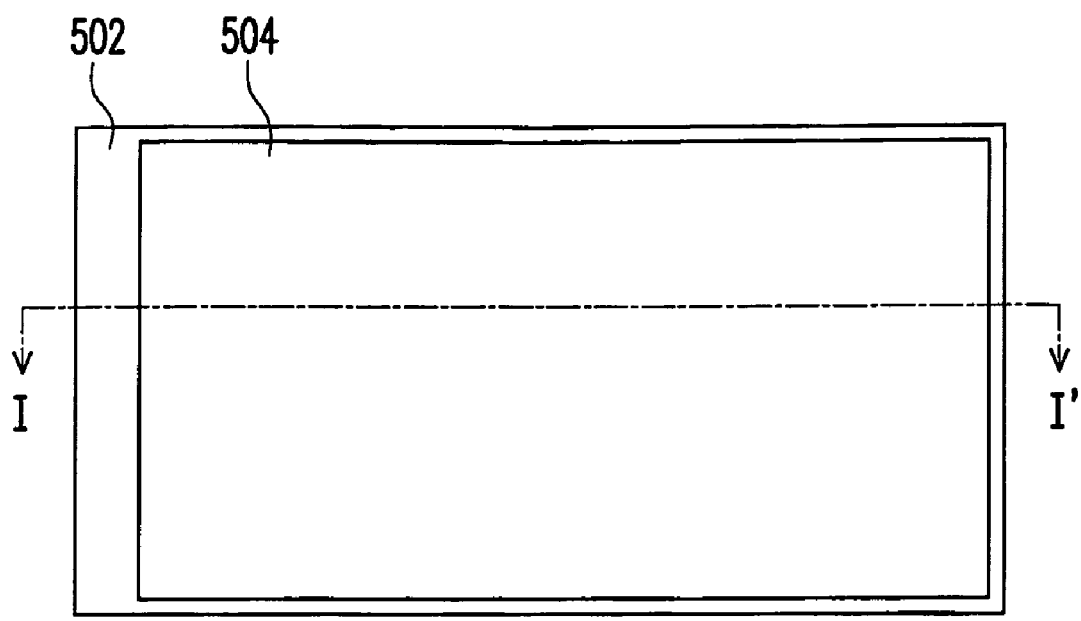
FIG. 10 through FIG. 15 illustrate a process flow for fabricating a thin film solar cell module of see-through type according to another embodiment of the present invention. Herein, the sub-diagrams (a) of FIG. 10 through FIG. 15 are schematic top views of FIG. 10 through FIG. 15. The sub-diagrams (b) of FIG. 10 through FIG. 15 are schematic cross-sectional views along the line I-I'. The sub-diagrams (c) of FIG. 11 through FIG. 15 are schematic cross-sectional views along the line II-II'.
Figure 10:
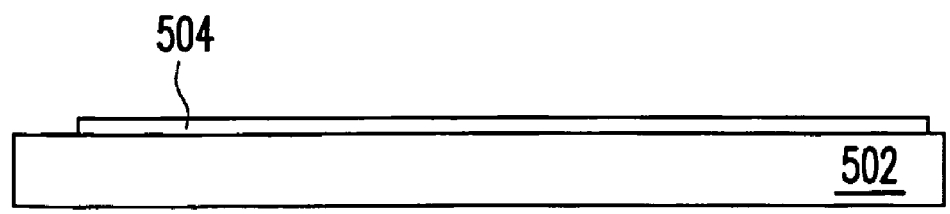
Figure 11:
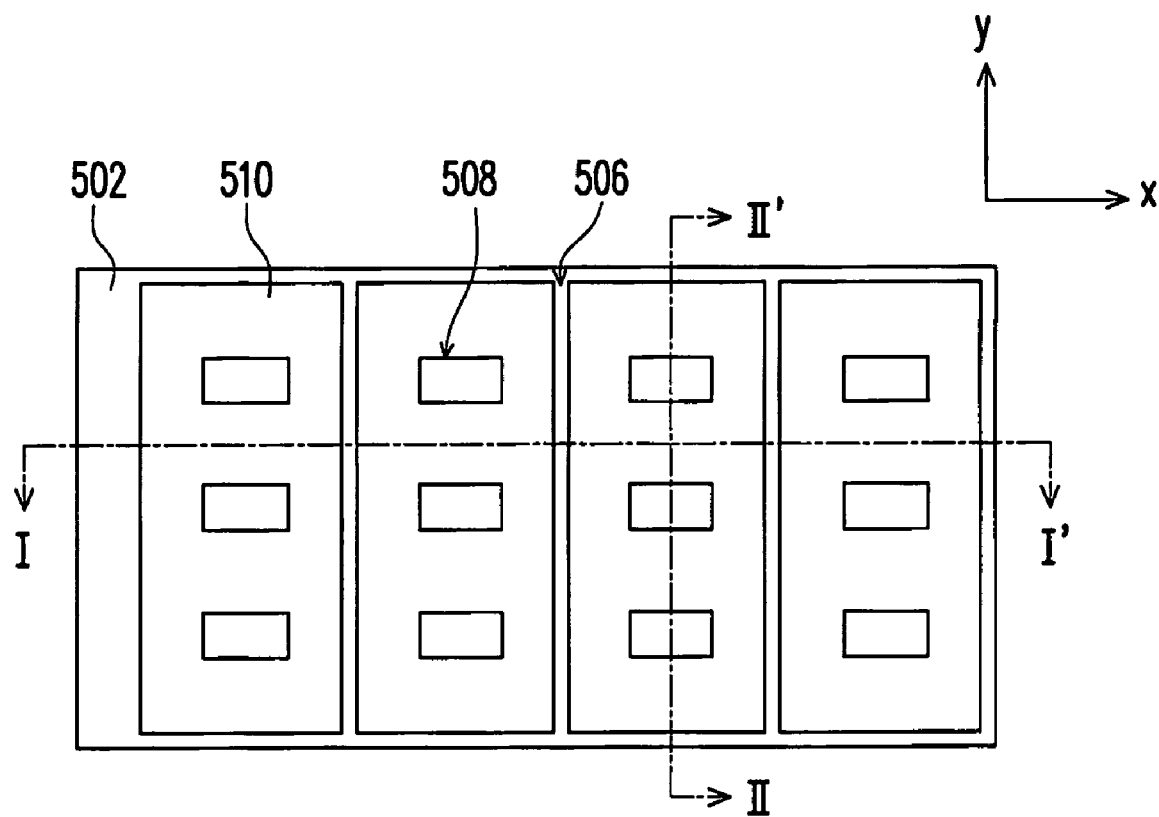
Figure 11:
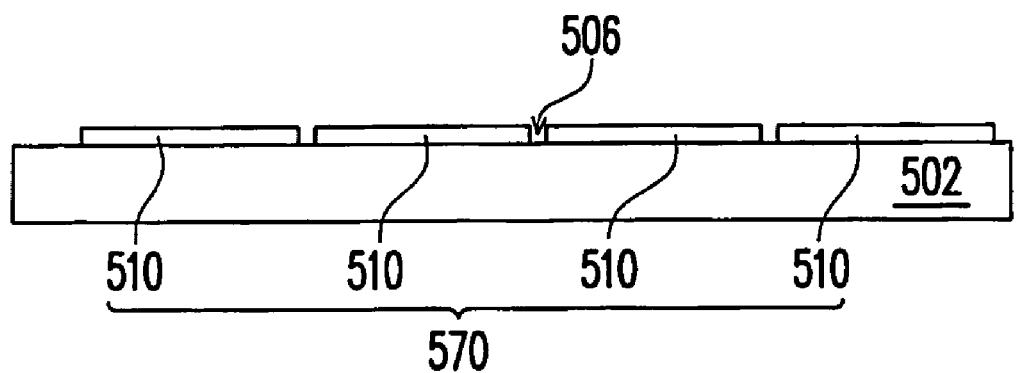
Figure 11:
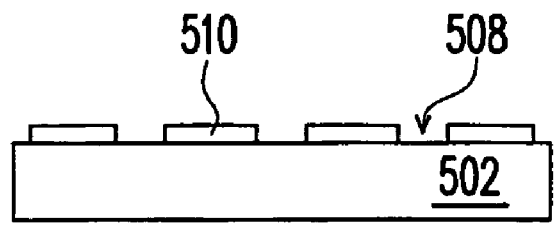
Figure 12:
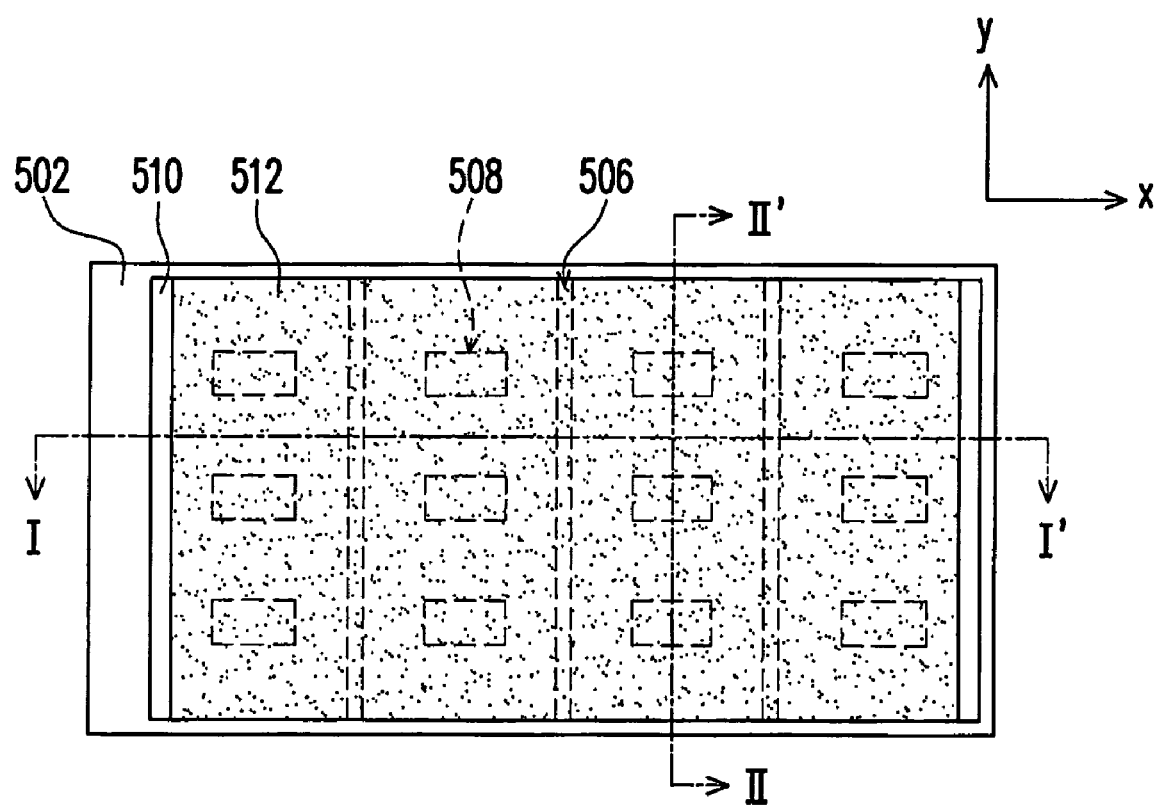
Figure 12:
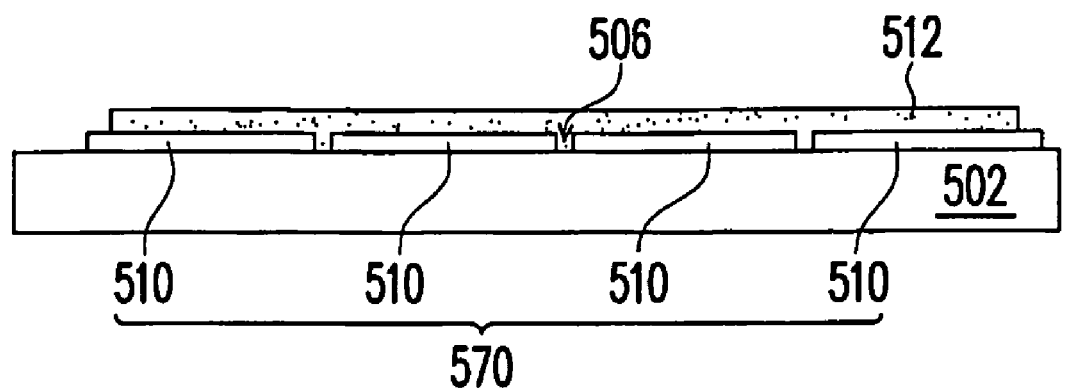
Figure 12:
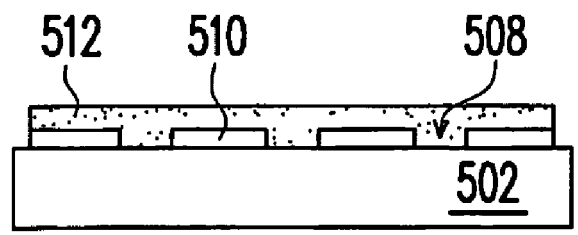
Figure 13:
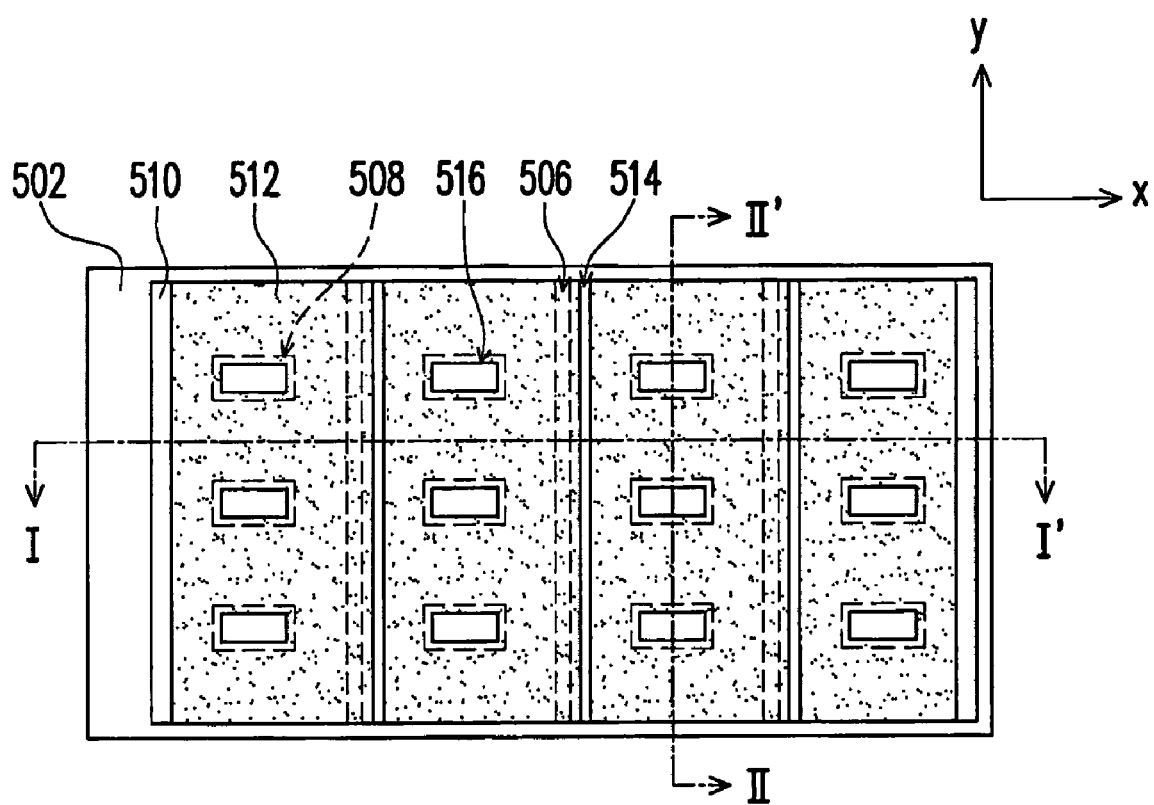
Figure 13:
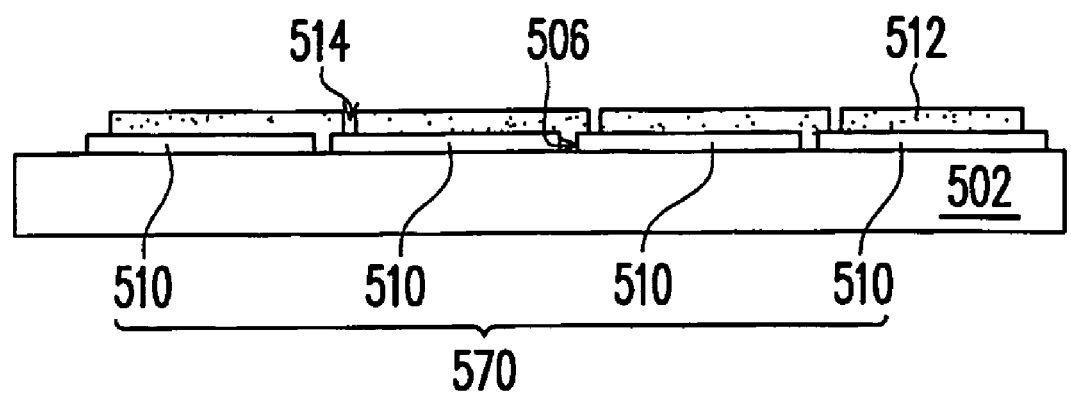
Figure 13:
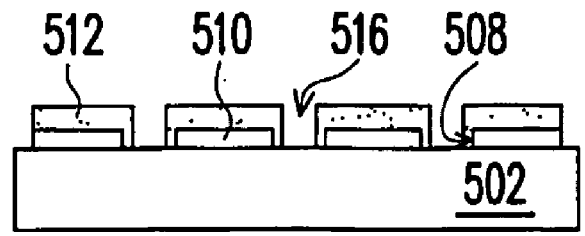
Figure 14:
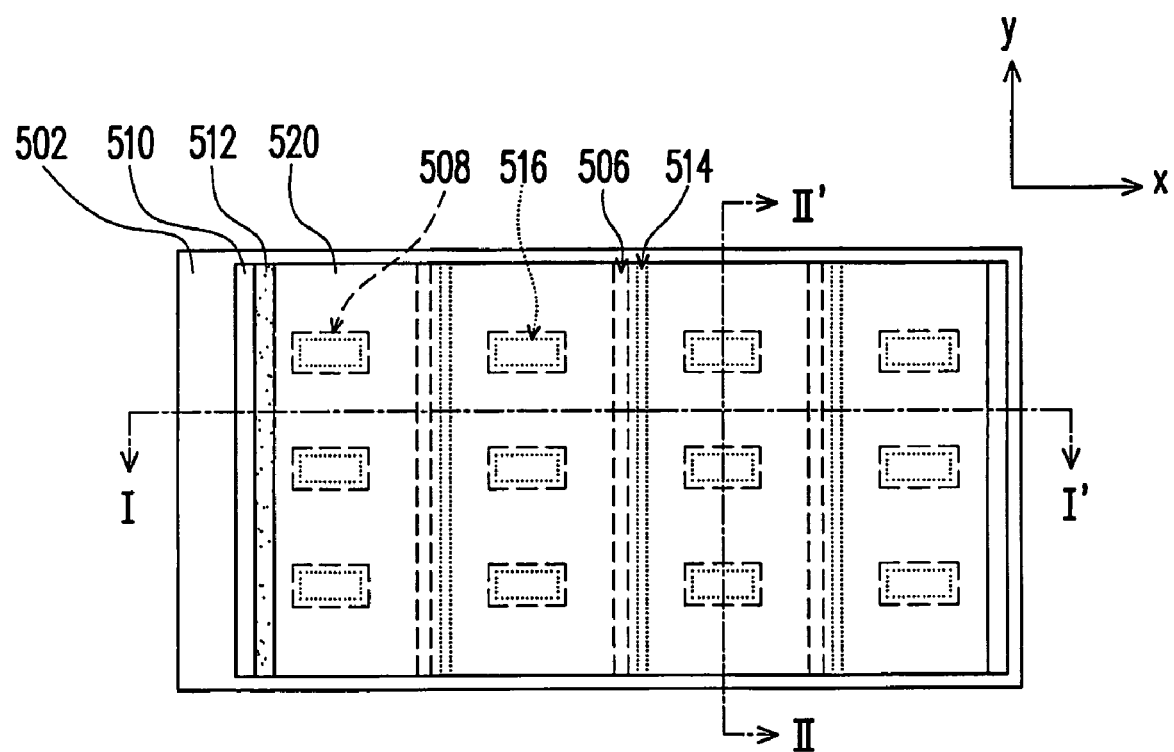
Figure 14:
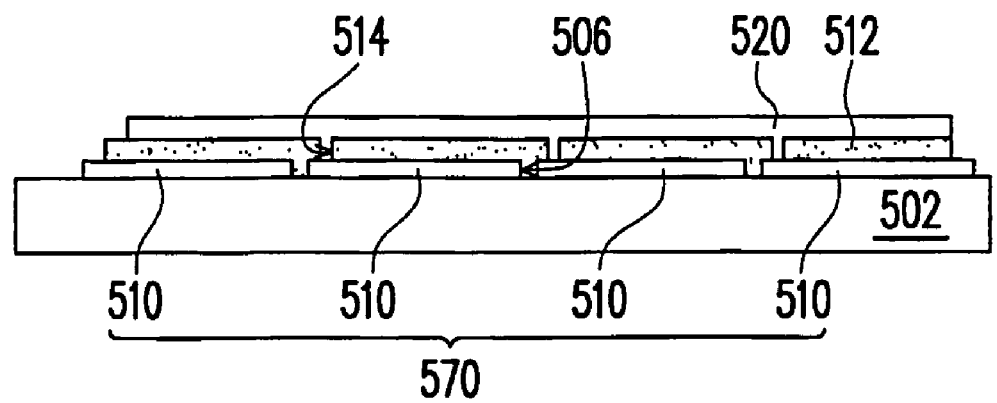
Figure 14:
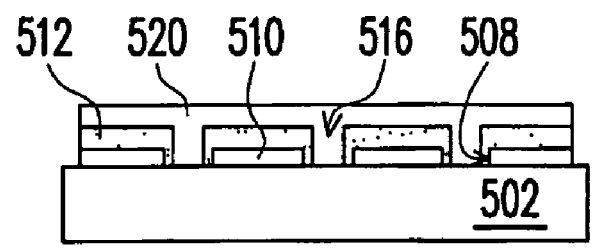
Figure 15:
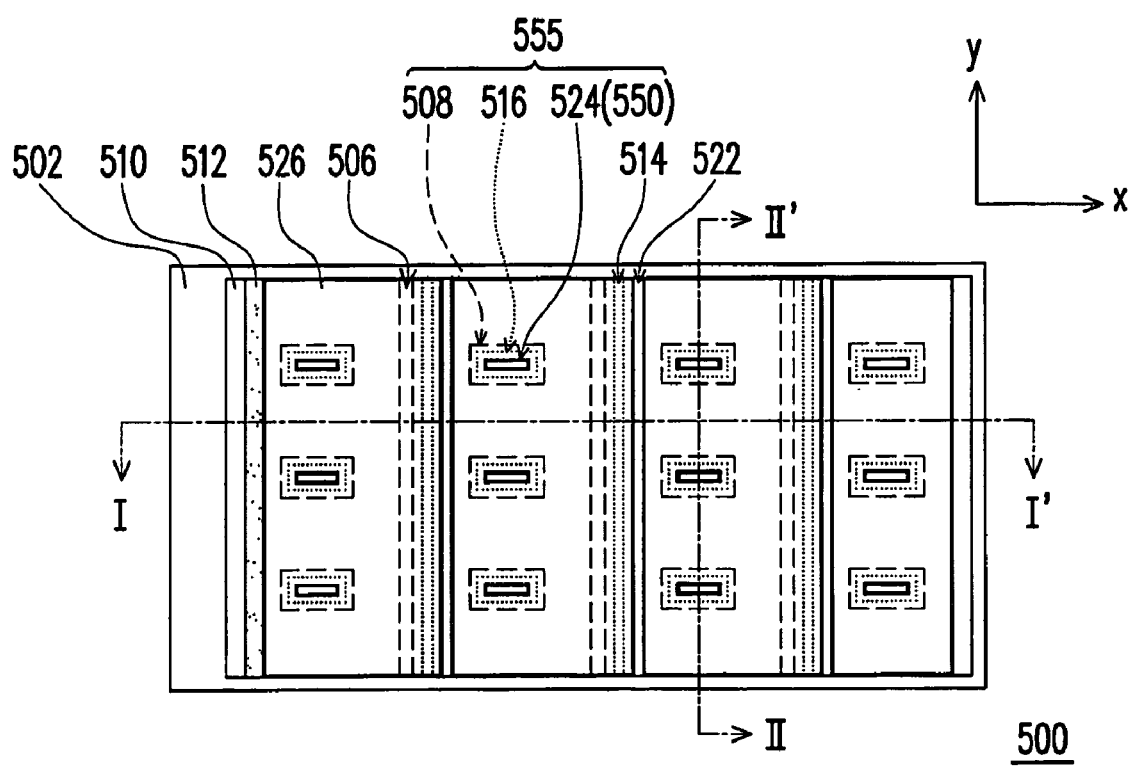
Figure 15:
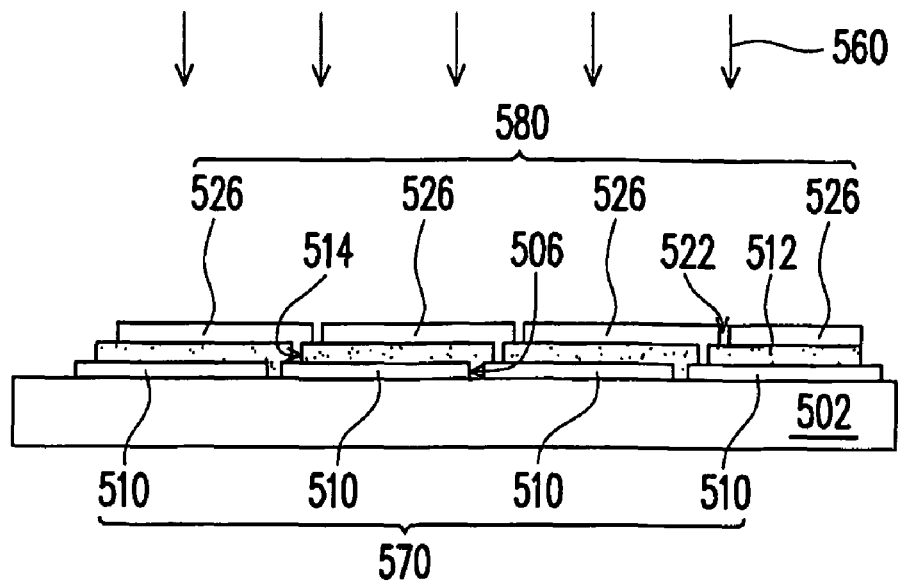
Figure 15:
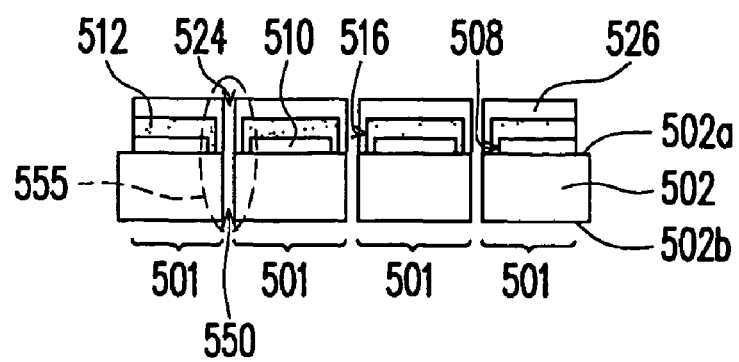

First, referring to FIGS. 9(a), 9(b), 9(b'), and 9(c), a thin film solar cell module of see-through type 400 according to the embodiment is composed of a plurality of cells 401 connected in series. The cells 401 are composed of a first electrode 470, a photoelectric conversion layer 414, and a second electrode 480. The cells 401 are arranged in an array. Rows of the cells 401 are separated by X-directional scribe lines 422 and 408; and columns of the cells 401 are separated by Y-directional scribe lines 420 and 406.

In other words, the X-directional scribe lines 408 and 422 divide the first electrode 470 and the second electrode 480 into a plurality of rows and expose an opaque substrate 402. The Y-directional scribe lines 420 divide the second electrode 480 into a plurality of columns and expose a portion of the first electrode 470 and a portion of the opaque substrate 402. The Y-directional scribe lines 406 divide the first electrode 407 into a plurality of columns and expose the opaque substrate 402. Moreover, the opaque substrate 402, which is exposed by the X-directional scribe lines 422 and the Y-directional scribe lines 420, has a plurality of holes 450 passing through a surface 402a and a surface 402b of the opaque substrate 402.

More specifically, the thin film solar cell module of see-through type 400 comprises the opaque substrate 402, on which the first electrode 470, the photoelectric conversion layer 414, and the second electrode 480 are disposed. Herein, the first electrode 470 is directly disposed on the opaque substrate 402 and is composed of a comb electrode 412 and a two-dimensional array composed of a plurality of block-like electrodes 410, which are formed by the X-directional scribe lines 408 and the Y-directional scribe lines 406. A material of the first electrode 470 is, for example, a transparent conductive oxide (TCO) layer or a metal layer. A material of TCO is, for example, zinc oxide (ZnO), tin oxide ($SnO_2$), indium-tin oxide (ITO), or indium oxide ($In_2O_3$). A material of the metal layer is, for example, Al, Ag, Mo, Cu, or other suitable metals or alloys.

The second electrode 480 is disposed above the first electrode 470 and is composed of a comb electrode 426 and a two-dimensional array composed of a plurality of block-like electrodes 424, which are formed by the X-directional scribe lines 422 and the Y-directional scribe lines 422. The comb electrodes 412 and 426 are disposed symmetrically, and the block-like electrodes 410 and 424 are disposed by parallel displacement. A material of the second electrode 480 is, for example, a TCO layer. A material of TCO is, for example, ZnO, ITO, or $In_2O_3$.

Moreover, the photoelectric conversion layer 414 is disposed between the first electrode 470 and the second electrode 480, and the photoelectric conversion layer 414 is composed of a two-dimensional array composed of a plurality of photoelectric conversion material layers. The photoelectric conversion layer 414 is a single-layered structure or a multi-layered structure. A material of the photoelectric conversion layer 414 is, for example, amorphous silicon and amorphous silicon alloy, CdS, $CuInGaSe_2$ (CIGS), $CuInSe_2$ (CIS), CdTe, an organic material, or a multi-layered structure comprising the aforesaid materials.

In aforementioned scribe lines, the Y-directional scribe lines 406, which divide the first electrode 470, are covered by the photoelectric conversion layer 414 and the second electrode 480. The Y-directional scribe lines 420, which divide the second electrode 480, expose a portion of the first electrode 470 and the opaque substrate 402. The X-directional scribe lines 408, which divide the first electrode 470, and the Y-directional scribe lines 422, which divide the second electrode 480, correspond to each other and expose the opaque substrate 402. In the present invention, it is noted that the opaque substrate 402, which is exposed by the X-directional scribe lines 422, the X-directional scribe lines 406, and the Y-directional scribe lines 420, has a plurality of holes 450 passing through the opaque substrate 402 from the surface 402a to the surface 402b.

The sizes of the holes 440 on the surface 402a may be the same or different from the sizes of the holes 440 on the surface 402b. For instance, the sizes of the holes 440 may gradually increase or decrease when passing through the opaque substrate 402 from the surface 402a to the surface 402b. Moreover, the holes 440 passing through the opaque substrate 402 do not have a specific pattern, and the holes 440 may be circular, square, rectangular, triangular, polygonal, or in an irregular shape.

In this embodiment, the thin film solar cell module of see-through type 400 comprises the X-directional scribe lines 422, the X-directional scribe lines 406, and the Y-directional scribe lines 420 which expose the opaque substrate 402. Further, the opaque substrate 402 has a plurality of holes 450. Consequently, light (sunlight) passes through the X-directional scribe lines 422, the Y-directional scribe lines 420, and the holes 450 in the opaque substrate 402 when transmitted through the second electrode 480 above the surface 402a of the opaque substrate 402. The light transmittance of the thin film solar cell module of see-through type 400 is therefore enhanced. Compared with the conventional thin film solar cell module of see-through type, the thin film solar cell module of see-through type according to this embodiment has a much better light transmittance.

On the other hand, as shown in FIG. 9(c), the first electrode is covered by the photoelectric conversion layer 414. As a consequence, the high-temperature laser scribing process does not cause the metal residues or melt of the second electrode, which would come into direct contact with the first electrode during the formation of the X-direction scribe lines 422. Hence, the problems, which affect the process yield and the efficiency of the solar cell, such as short circuit or current leakage resulted from recrystallization of the amorphous silicon photoelectric conversion layer on the sidewalls of the grooves to produce low resistant micro-crystalline (nano-crystalline) silicon are avoided.

In the following paragraphs, FIG. 4 through FIG. 9 illustrate a method for fabricating the thin film solar cell module of see-through type 400 according to the embodiment of the present invention.

First, referring to FIG. 4(a) and FIG. 4(b), an opaque substrate 402 is provided. A material of the opaque substrate 402 is, for example, a thin metal plate, a plastic substrate, a ceramic substrate, or other suitable opaque materials. Next, an electrode material layer 404 is formed on the opaque substrate 402. The electrode material layer 404 is a transparent conductive oxide layer (TCO) or a metal layer. A material of TCO is, for example, ZnO, $SnO_2$, ITO, or $In_2O_3$. A material of the metal layer is, for example, Al, Ag, Mo, Cu, or other suitable metals or alloys. A method for forming the electrode material layer 404 is, for example, CVD method, sputtering method, or other suitable methods.

Certainly, a surface of the electrode material may be textured to reduce the reflection of light so as to improve the efficiency of the solar cells. The textured surface would result in the scattering of light, reduce the reflection of incident light, and increase the propagation distance of the incident light in the photoelectric conversion layer. Therefore, V-shaped grooves, pyramid-like structures (not shown), or inverted pyramid-like structures are usually formed on the surface of the electrode material layer.

Then, referring to FIG. 5(a) and FIG. 5(b), a portion of the electrode material layer 404 is removed to form a plurality of Y-directional scribe lines 406 and a plurality of X-directional scribe lines 408 which intersects with the Y-directional scribe lines 406. Herein, the electrode material layer 404 may be divided into a plurality of banding electrode material layers (not shown) during the formation of the Y-directional scribe lines 406. After the Y-directional scribe lines 406 and the X-directional scribe lines 408 are formed, the electrode material layer 404 may be divided into a comb electrode 412 and a two-dimensional array composed of a plurality of block-like electrodes 410 to form the first electrode 470 of the cell module. A method for forming the Y-directional scribe lines 406 and the X-directional scribe lines 408 is, for example, removing a portion of the electrode material layer 404 by a laser scribing process.

Thereafter, referring to FIG. 6(a) and FIG. 6(b), a photoelectric conversion layer 414 is formed on the opaque substrate 402. The photoelectric conversion layer 414 covers the opaque substrate 402, the block-like electrodes 410, and a portion of the comb electrode 412. The photoelectric conversion layer 414 is a single-layered structure or a multi-layered structure. A material of the photoelectric conversion layer 414 is, for example, amorphous silicon and amorphous silicon alloy, CdS, $CuInGaSe_2$ (CIGS), $CuInSe_2$ (CIS), CdTe, an organic material, or a multi-layered structure comprising the aforesaid materials. A method for forming the photoelectric conversion layer 414 is, for example, CVD method, sputtering method, or other suitable methods. Further, it is noted that the above-mentioned amorphous silicon alloy refers to amorphous silicon with the addition of elements such as H, F, Cl, Ge, O, C, or N. If elements such as H, F, and Cl are added to amorphous silicon, the defects in a silicon thin film are repaired to obtain a better thin film quality. However, if elements such as Ge are added, the band gap of the silicon thin film is decreased to absorb sunlight of longer wavelength. On the other hand, if elements such as oxygen, carbon, and nitrogen are added to amorphous silicon, the band gap of the silicon thin film is increased to absorb sunlight of shorter wavelength.

Referring to FIG. 7(a) and FIG. 7(b), a portion of the photoelectric conversion layer 414 is removed to form a plurality of Y-directional scribe lines 416. The Y-directional scribe lines 416 are parallel to the Y-directional scribe lines 406 and expose the block-like electrodes 410 underneath. A method for forming the Y-directional scribe lines 416 is, for example, removing a portion of the photoelectric conversion layer 414 by a laser scribing process.

Referring to FIG. 8(a) and FIG. 8(b), an electrode material layer 418 is formed on the opaque substrate 402. The electrode material layer 418 covers the photoelectric conversion layer 414, the electrodes 410, and the opaque substrate 402. The electrode material layer 418 is a transparent conductive oxide layer (TCO). A material of TCO is, for example, ZnO, $SnO_2$, ITO, or $In_2O_3$. A method for forming the electrode material layer 418 is, for example, CVD method, sputtering method, or other suitable methods.

Thereafter, referring to FIGS. 9(a), 9(b), 9(b'), and 9(c), a plurality of Y-directional scribe lines 420 and a plurality of X-directional scribe lines 422 which intersects with the Y-directional scribe lines 420 are formed. In an embodiment, the Y-directional scribe lines 420 divide the electrode material layer 418 in a Y-direction and the X-directional scribe lines 422 divide the electrode material layer 418 in an X-direction to form a comb electrode 426 and a two-dimensional array composed of a plurality of block-like electrodes 424 in the electrode material layer 418 so as to form the second electrode 480 of the cell module. In another embodiment, as shown in FIG. 9(a'), the Y-directional scribe lines 420 divide the electrode material layer 418, but the X-directional scribe lines 422 do not divide the electrode material layer 418. Consequently, the electrode material layer 418 is divided into a plurality of block-like electrodes 424 and a plurality of block-like electrodes 426' to form the second electrode 480 of the cell module. In other words, the X-directional scribe lines 422 do not break apart the electrode material layer 418. Referring to FIG. 9(a), the block-like electrodes 424 arranged in parallel in the Y-direction are electrically connected by a connection section 425 shown in FIG. 9(a'), and comb-teeth portions of the comb electrode 426 are connected by a connection section 425' shown in FIG. 9(a') so as to respectively compose the block-like electrodes 424' and 426' shown in FIG. 9(a'). The shape and number of the connection section 425 are various and are not limited to the illustrations of the figures. The scope of the present invention lies in the idea that the X-directional scribe lines 422 do not break apart the electrode material layer 418. The X-directional scribe lines 422 are formed by removing a portion of the electrode material layer 418 and a portion of the photoelectric conversion layer 414 until the surface of the opaque substrate 402 is exposed. In addition, the Y-directional scribe lines 420 are formed by removing a portion of the electrode material layer 418 in the Y-directional scribe lines 416 until the electrode 410 and the surface of the opaque substrate 402 are exposed.

In yet another embodiment, as shown in FIG. 9(b'), the Y-directional scribe lines 420 are formed by removing a portion of the electrode material layer 418 and the photoelectric conversion layer 414 until the surface of the electrode 410 is exposed, and the Y-directional scribe lines 420 are disposed by position displacement corresponding to the Y-directional scribe lines 416. Similarly, the Y-directional scribe lines 420 and the X-directional scribe lines 422 may be formed by using a laser scribing process to remove a portion of the electrode material layer 418 and a portion of the photoelectric conversion layer 414.

Thereafter, a plurality of holes 450 is formed in the opaque substrate 402 exposed by the X-directional scribe lines 422 and the Y-directional scribe lines 420. The holes 450 on the surfaces 402a and 402b of the opaque substrate 402 do not have a specific pattern, and the holes 450 may be circular, square, rectangular, triangular, polygonal, grooved, or in an irregular shape. Moreover, the sizes of the holes 450 passing through the opaque substrate 402 from the surface 402a to the surface 402b may be the same or different. For instance, the sizes of the holes 450 may gradually increase or decrease when passing through the opaque substrate 402 from the surface 402a to the surface 402b. A method for forming the holes 450 is, for example, a laser scribing process, which uses high temperature to remove the substrate, or an etching process.

Accordingly, the thin film solar cell module of see-through type 400 of this embodiment is completed by performing the above-mentioned processes. When the thin film solar cell module of see-through type is in use, light (sunlight) 460 is transmitted through the second electrode 480 and a portion of light is absorbed by the photoelectric conversion layer 414 of each cell 401 to perform a photoelectric conversion so as to generate a voltage; another portion of light 460 is transmitted through the X-directional scribe lines 422 and the Y-directional scribe lines 420, and then through the holes 450 in the opaque substrate 402 to the surface 402b of the opaque substrate 402.

In addition, the thin film solar cell module of see-through type 400 of the embodiment may be fabricated by other methods. For example, during the formation of the Y-directional scribe lines 416 in the photoelectric conversion layer 414 (as shown in FIGS. 7(a) and 7(b)), a plurality of X-directional scribe lines (not shown) which intersects with the Y-directional scribe lines 416 is also formed to divide the photoelectric conversion layer 414 into a plurality of block-like photoelectric conversion layers (not shown). The following processes are similar to the aforementioned embodiment. Detailed descriptions thereof are thus omitted.

In addition to the above embodiments, the present invention also provides other implementations.

FIG. 10 through FIG. 15 illustrate a process flow for fabricating a thin film solar cell module of see-through type according to another embodiment of the present invention. Herein, the sub-diagrams (a) of FIG. 10 through FIG. 15 are schematic top views of FIG. 10 through FIG. 15. The sub-diagrams (b) of FIG. 10 through FIG. 15 are schematic cross-sectional views along the line I-I'. The sub-diagrams (c) of FIG. 10 through FIG. 15 are schematic cross-sectional views along the line II-II'. The descriptions of the elements in FIG. 10 through FIG. 15 identical to the elements in FIG. 4 through FIG. 9 are omitted.

First, please refer to FIGS. 15(a), 15(b), and 15(c). A thin film solar cell module of see-through type 500 of the embodiment has a plurality of cells 501 which are connected in series in an X-direction and connected in parallel in a Y-direction. Further, a plurality of X-directional scribe windows 524 which exposes an opaque substrate 502 is among the cells 501. When light (sunlight) 560 is transmitted through the top of the opaque substrate 502, the light 560 passes through the X-directional scribe windows 524. Thereby, the transparency of the thin film solar cell module of see-through type 500 is achieved.

The thin film solar cell module of see-through type 500 comprises the opaque substrate 502 on which a first electrode 570, a second electrode 580, and a photoelectric conversion layer 512 are disposed. Herein, the opaque substrate 502 has a plurality of holes 550. The first electrode 570 is directly disposed on the opaque substrate 502 and composed of a plurality of window electrodes 510, which is arranged in parallel and has a plurality of scribe windows 508. The first electrode 570 is, for example, a TCO layer or a metal layer. A material of TCO is, for example, ZnO, SnO$_2$, ITO, or In$_2$O$_3$. A material of the metal layer is, for example, Al, Ag, Mo, Cu, or other suitable metals or alloys. The second electrode 580 is disposed on the first electrode 570 and composed of a plurality of window electrodes 526, which is arranged in parallel and has a plurality of scribe windows 524. In addition, the window electrodes 510 and 526 are disposed by parallel displacement. The second electrode 580 is, for example, a TCO layer. A material of TCO is, for example, ZnO, SnO$_2$, ITO, or In$_2$O$_3$. Moreover, the photoelectric conversion layer 512 is disposed between the first electrode 570 and the second electrode 580, and the photoelectric conversion layer 512 is composed of a plurality of window photoelectric conversion material layers, which is arranged in parallel and has a plurality of scribe windows 516. The photoelectric conversion layer 512 is a single-layered structure or a multi-layered structure. A material of the photoelectric conversion layer 512 is, for example, amorphous silicon and amorphous silicon alloy, CdS, CuInGaSe$_2$ (CIGS), CuInSe$_2$ (CIS), CdTe, an organic material, or a multi-layered structure comprising the aforesaid materials. The scribe windows 516, the scribe windows 508, and the scribe windows 524 correspond to the holes 550 in the opaque substrate 502. Thereby, a plurality of through holes 555 is formed. The through holes 555 do not have a specific pattern, and the through holes 555 may be circular, square, rectangular, polygonal, or in an irregular shape.

The sizes of the holes 550 on a surface 502a of the opaque substrate 502 may be the same or different from the sizes of the holes 550 on a surface 502b. For instance, the sizes of the holes 550 may gradually increase or decrease when passing through the opaque substrate 502 from the surface 502a to the surface 502b. Moreover, the holes 550 in the opaque substrate 502 do not have a specific pattern, and the holes 550 on the surfaces 502a and 502b may have various patterns such as circular, square, rectangular, triangular, polygonal, or an irregular shape.

The thin film solar cell module of see-through type 500 of this embodiment has the through holes 555, and therefore the transmittance of the cell module is increased. Hence, compared with the conventional thin film solar cell module of see-through type, the thin film solar cell module of see-through type according to this embodiment has a better light transmittance. In addition, as shown in FIG. 15(c), the first electrode 570 is covered by the photoelectric conversion layer 512. Consequently, the problems of short circuit and current leakage caused by the contact between the first electrode 570 and the metal residues or melt of the second electrode 580, which occur during the high-temperature laser scribing process, are prevented. Thereby, the process yield and the efficiency of the solar cell are maintained.

In the following paragraphs, FIG. 10 through FIG. 15 illustrate a method for fabricating the thin film solar cell module of see-through type 500 according to the embodiment of the present invention.

First, referring to FIG. 10(a) and FIG. 10(b), the opaque substrate 502 is provided. A material of the opaque substrate 502 is, for example, a thin metal plate, a plastic substrate, a ceramic substrate, or other suitable opaque materials. Next, an electrode material layer 504 is formed on the opaque substrate 502. The electrode material layer 504 is a TCO layer or a metal layer. A material of TCO is, for example, ZnO, SnO$_2$, ITO, or In$_2$O$_3$. A material of the metal layer is, for example, Al, Ag, Mo, Cu, or other suitable metals or alloys.

Then, referring to FIGS. 11(a), 11(b), and 11(c), a plurality of Y-directional scribe lines 506 is formed in the electrode material layer 504, which divides the electrode material layer 504 into a plurality of banding electrode material layers. Further, a two-dimensional array composed of a plurality of X-directional scribe windows 508 is formed. The Y-directional scribe lines 506 and the X-directional scribe windows 508 divide the electrode material layer 504 into a plurality of window electrodes 510.

Thereafter, referring to FIGS. 12(a), 12(b), and 12(c), a photoelectric conversion layer 512 is formed on the opaque substrate 502. The opaque substrate 502 and the window electrodes 510 are covered by the photoelectric conversion layer 512.

Next, referring to FIGS. 13(a), 13(b), and 13(c), a portion of the photoelectric conversion layer 512 is removed to form a plurality of Y-directional scribe lines 514 and a plurality of X-directional scribe windows 516. Herein, the Y-directional scribe lines 514 are formed above the window electrodes 510 and are parallel to the Y-directional scribe lines 506; and the X-directional scribe windows 516 are formed in the X-directional scribe windows 508 and are arranged as a two-dimensional array.

In this fabricating process, a portion of the photoelectric conversion layer 512 may be removed to form only the Y-directional scribe lines 514 without forming the X-directional scribe windows 516 shown in FIGS. 13(a), 13(b), and 13(c). Persons skilled in this art would know such a modification. The figures for the above-mentioned embodiment are therefore omitted hereby.

Thereafter, referring to FIGS. 14(a), 14(b), and 14(c), an electrode material layer 520 is formed above the opaque substrate 502. The electrode material layer 520 covers the photoelectric conversion layer 512, the window electrodes 510, and the opaque substrate 502. The electrode material layer 520 is a TCO layer. A material of TCO is, for example, ZnO, SnO$_2$, ITO, or In$_2$O$_3$.

Then, referring to FIGS. 15(a), 15(b), and 15(c), a plurality of Y-directional scribe lines 522 and a plurality of X-directional scribe windows 524 are formed to divide the electrode material layer 520 into a plurality of window electrodes 526. Herein, the Y-directional scribe lines 522 are formed by removing a portion of the electrode material layer 520 and a portion of the photoelectric conversion layer 512 until a surface of the window electrode 510 is exposed. The X-directional scribe windows 524 are formed by removing a portion of the electrode material layer 520 in the X-directional scribe windows 516 to expose the opaque substrate 502 underneath.

In view of the above, if the last process only comprises the formation of the Y-directional scribe lines 514, the X-directional scribe windows 524 are formed by removing a portion of the electrode material layer 520 and a portion of the photoelectric conversion layer 512 in the X-directional scribe windows 516.

Thereafter, the opaque substrate 502 exposed by the X-directional scribe windows 516 is removed to form the holes 550 passing through the surfaces 502a and 502b. The holes 550 in the opaque substrate 502 correspond to the scribe windows 516, the scribe windows 508, and the scribe windows 524. Thereby, a plurality of through holes 555 is formed. A method for forming the holes 550 is, for example, a laser scribing process, which uses high temperature to remove the substrate, or an etching process.

After the above-mentioned processes are performed, the thin film solar cell module of see-through type 500, which has a plurality of through holes 555, according to this embodiment is completed.

In summary, according to the thin film solar cell module of see-through type and the method for fabricating the same in the present invention, bi-directional scribe lines or scribe window are formed during the formation of the first electrode. Consequently, the thin film solar cell module of see-through type fabricated according to the present invention overcomes the problems of short circuit and current leakage resulted from the high-temperature laser scribing process, and prevents the process yield and the efficiency of the solar cells from being affected. In addition, compared with the conventional thin film solar cell module of see-through type, the thin film solar cell module of see-through type according to the present invention comprises holes in the opaque substrate to greatly increase the light transmittance of the cell module.

Although the present invention has been disclosed by the above embodiments, they are not intended to limit the present invention. Anybody skilled in the art may make some modifications and alterations without departing from the spirit and scope of the present invention. Therefore, the protection range of the present invention falls in the appended claims.

What is claimed is:

1. A thin film solar cell module of see-through type having a plurality of cells connected in series in the X-direction and connected in parallel in the Y-direction, and having a plurality of through holes formed in an opaque substrate among the cells, the thin film solar cell module comprising:

the opaque substrate having a plurality of holes, wherein the opaque substrate includes a plastic substrate or a ceramic substrate;

a first electrode disposed on the opaque substrate and composed of a plurality of block-like first window electrodes which has a plurality of first scribe windows corresponding to the plurality of holes;

a second electrode disposed on the first electrode and composed of a plurality of block-like second window electrodes which has a plurality of second scribe windows corresponding to the plurality of holes and the first scribe windows so as to form the plurality of through holes, wherein the second window electrodes and the first window electrodes are disposed by parallel displacement; and a photoelectric conversion layer disposed between the first electrode and the second electrode, and composed of a plurality of window photoelectric conversion material layers;

wherein a top surface and sidewalls of the first electrode around the plurality of holes are covered by the photoelectric conversion layer and not in direct contact with the second electrode, and a top surface and sidewalls of the photoelectric conversion layer around the plurality of holes are covered by the second electrode, and the second electrode and the photoelectric conversion layer do not extend over sidewalls of the plurality of holes in the opaque substrate.

2. The thin film solar cell module of see-through type of claim 1, wherein the first electrode is a transparent conductive oxide layer or a metal layer.

3. The thin film solar cell module of see-through type of claim 2, wherein a material of the transparent conductive oxide layer comprises ZnO, $SnO_2$, ITO, or $In_2O_3$; and a material of the metal layer comprises Al, Ag, Cu, Mo, or an alloy thereof.

4. The thin film solar cell module of see-through type of claim 1, wherein the photoelectric conversion layer is a single-layered structure.

5. The thin film solar cell module of see-through type of claim 1, wherein a material of the photoelectric conversion layer comprises amorphous silicon and amorphous silicon alloy, CdS, $CuInGaSe_2$ (CIGS), $CuInSe_2$ (CIS), CdTe, or an organic material.

6. The thin film solar cell module of see-through type of claim 1, wherein the second electrode is a transparent conductive oxide layer.

7. The thin film solar cell module of see-through type of claim 6, wherein a material of the transparent conductive oxide layer comprises ZnO, $SnO_2$, ITO, or $In_2O_3$.

8. The thin film solar cell module of see-through type of claim 1, wherein the photoelectric conversion layer is a multi-layered structure.

* * * * *